(12) United States Patent
Shim

(10) Patent No.: US 7,595,265 B2
(45) Date of Patent: Sep. 29, 2009

(54) SEMICONDUCTOR DEVICE AND METHOD FOR FORMING A METAL LINE IN THE SEMICONDUCTOR DEVICE

(75) Inventor: Joon-Bum Shim, Seongnam (KR)

(73) Assignee: Dongbu Electronics Co., Ltd., Seoul (KR)

(*) Notice: Subject to any disclaimer, the term of this patent is extended or adjusted under 35 U.S.C. 154(b) by 344 days.

(21) Appl. No.: 11/212,998

(22) Filed: Aug. 26, 2005

(65) Prior Publication Data
US 2006/0046466 A1    Mar. 2, 2006

(30) Foreign Application Priority Data
Aug. 26, 2004    (KR) .................. 10-2004-0067373

(51) Int. Cl.
*H01L 21/44*    (2006.01)
(52) U.S. Cl. .................. 438/669; 438/666; 438/720; 257/775; 257/E21.589; 257/E29.112
(58) Field of Classification Search .................. 438/638, 438/669, 666, 720; 257/775, E21.483, E21.582, 257/E21.589, E29.111, E29.112
See application file for complete search history.

(56) References Cited
U.S. PATENT DOCUMENTS

| | | | |
|---|---|---|---|
| 4,860,084 A * | 8/1989 | Shibata .................. | 257/288 |
| 4,948,459 A * | 8/1990 | van Laarhoven et al. .... | 438/622 |
| 5,008,216 A | 4/1991 | Huang et al. | |
| 5,008,730 A | 4/1991 | Huang et al. | |
| 5,082,801 A * | 1/1992 | Nagata .................. | 438/640 |
| 5,403,779 A | 4/1995 | Joshi et al. | |
| 5,409,861 A * | 4/1995 | Choi .................. | 438/644 |
| 5,494,853 A * | 2/1996 | Lur .................. | 438/631 |
| 5,633,198 A * | 5/1997 | Lur et al. .................. | 438/618 |
| 5,716,888 A * | 2/1998 | Lur et al. .................. | 438/619 |
| 5,889,328 A | 3/1999 | Joshi et al. | |
| 5,952,723 A * | 9/1999 | Takeyasu et al. .......... | 257/771 |
| 6,083,842 A * | 7/2000 | Cheung et al. .............. | 438/706 |
| 7,148,572 B2 * | 12/2006 | Domae et al. .............. | 257/758 |

* cited by examiner

*Primary Examiner*—Caridad M Everhart
(74) *Attorney, Agent, or Firm*—The Law Offices of Andrew D. Fortney; Andrew D. Fortney; Duangkamol Kay Strohl

(57) ABSTRACT

Contact resistance of a semiconductor device may be reduced, and thereby the reliability of the semiconductor device may be enhanced, when a metal line is formed in a semiconductor device according to a method including: (i) forming a metal layer on a semiconductor substrate; (ii) forming a groove on an upper surface of the metal layer by etching the metal layer; (iii) etching the metal layer so as to form a groove-engraved lower metal line that is wider than the groove; (iv) forming an insulator layer covering the semiconductor substrate and the groove-engraved lower metal line; (v) etching the insulator layer so as to form a contact hole exposing the groove; and (vi) forming a contact electrode filling the contact hole and an upper metal line connected thereto, above the insulator layer.

15 Claims, 5 Drawing Sheets

SEMICONDUCTOR DEVICE AND METHOD FOR FORMING A METAL LINE IN THE SEMICONDUCTOR DEVICE

CROSS-REFERENCE TO RELATED APPLICATION

This application claims priority to and the benefit of Korean Patent Application 10-2004-0067373 filed in the Korean Intellectual Property Office on Aug. 26, 2004, the entire contents of which are incorporated herein by reference.

BACKGROUND OF THE INVENTION (a) Field of the Invention

The present invention generally relates to a semiconductor device and a method for forming a metal line in the semiconductor device. More particularly, the present invention relates to a semiconductor device and a method for forming a metal line in the semiconductor device having an advantage of reduced contact resistance.

(b) Description of the Related Art

As semiconductor devices become more integrated, metal lines are usually fabricated in a multi-layer structure.

FIG. 2A to FIG. 2E are cross-sectional views showing sequential stages of a conventional method for forming a metal line in a semiconductor device.

Referring to FIG. 2A, metal layer 204 may be formed on semiconductor substrate 202 by depositing a metal material thereon by a physical vapor deposition (PVD) method, an ion beam method, an electron beam method, or a radio-frequency (RF) sputtering method, for example. Then, photoresist pattern 206 for etching the metal layer 204 can be formed on metal layer 204.

Subsequently, as shown in FIG. 2B, metal layer 204 can be dry etched according to photoresist pattern 206. Thus, lower metal line 204a may be formed on semiconductor substrate 202. Then, a cleaning process is performed and photoresist pattern 206 may be removed.

As shown in FIG. 2C, insulator layer 208 can be formed on semiconductor substrate 202 and lower metal line 204a by depositing an insulating material, such as a high density plasma (HDP) oxide layer. Then, a surface of insulator layer 208 may be planarized by a chemical mechanical polishing (CMP) process, for example.

In addition, as shown in FIG. 2D, photoresist pattern 210 for forming a contact hole can be formed on insulator layer 208.

Now, insulator layer 208 may be etched using photoresist pattern 210 and, accordingly, contact hole 212 for a contact to lower metal line 204a may be formed, as shown in FIG. 2E. Then, photoresist pattern 210 can be removed.

Here, a metal material can then be filled into contact hole 212 so as to form a contact electrode (not shown), and then an upper metal line (not shown) can be formed by depositing a metal material by various methods, such as an ion beam method, an electron beam method, or an RF sputtering method.

A continuing trend in semiconductor devices is that an available area per device has been reduced due to higher integration of the semiconductor devices. Thus, a size of a contact hole connecting two metal lines or a semiconductor substrate and a metal line has been also reduced. Furthermore, widths of metal lines have also been reduced. Therefore, in this case, contact resistance may be excessively increased when a semiconductor device is made according to such a conventional method. That is, an effective contact area may be problematic for a semiconductor device that has been highly integrated.

The above information disclosed in this Background section is only for enhancement of understanding of the background of the invention and therefore it may contain information that does not form prior art or other information that may be already known in this or any other country to a person of ordinary skill in the art.

SUMMARY OF THE INVENTION

An object of embodiments of the present invention is to provide a semiconductor device and a method for forming a metal line in a semiconductor device having an advantage of reduced contact resistance by increasing an effective contact area of a contact hole in the semiconductor device.

An exemplary method for forming a metal line in a semiconductor device according to an embodiment of the present invention can include: (i) forming a metal layer on a semiconductor substrate; (ii) forming a groove on an upper surface of the metal layer by etching the metal layer; (iii) etching the metal layer so as to form a groove-engraved lower metal line that is wider than the groove; (iv) forming an insulator layer covering the semiconductor substrate and the groove-engraved lower metal line; (v) etching the insulator layer so as to form a contact hole exposing the groove of the groove-engraved lower metal line; and (vi) forming a contact electrode filling the contact hole and an upper metal line connected thereto above the insulator layer.

The metal layer may be formed to a thickness of about 4,000 Å-6,000 Å, for example. A BCl3 or Cl2 gas may be used for etching the metal layer and etch selectivity of the metal layer may be maintained to a level of at least 1:1 with respect to the photoresist. The groove of the metal layer may be etched to a depth of about 500 Å-1,500 Å, for example.

An exemplary semiconductor device according to an embodiment of the present invention can include: (i) a semiconductor substrate; (ii) a lower metal line formed on the semiconductor substrate and engraved with a groove at a top thereof; (iii) an insulator layer formed above the lower metal line and formed with a contact hole exposing the groove; (iv) a contact electrode filling the contact hole; and (v) an upper metal line connected with the contact electrode. The metal layer may be formed to a thickness of 4,000 Å-6,000 Å, for example. The groove of the metal layer may be etched to a depth of 500 Å-1,500 Å, for example.

DETAILED DESCRIPTION OF THE EMBODIMENTS

An embodiment of the present invention will hereinafter be described in detail with reference to the accompanying drawings.

FIG. 1A to FIG. 1G are cross-sectional views showing sequential stages of a method for forming a metal line in a semiconductor device according to an exemplary embodiment of the present invention.

Figure 1A:
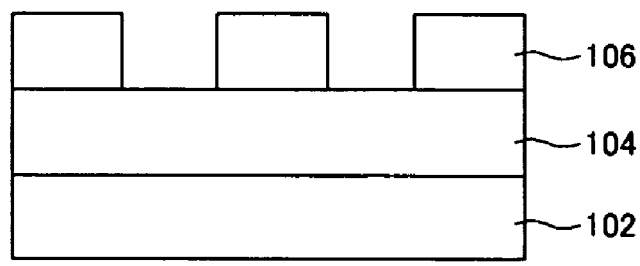
FIG. 1A to FIG. 1G are cross-sectional views showing sequential stages of a method for forming a metal line in a semiconductor device according to an exemplary embodiment of the present invention.

Referring to FIG. 1A, metal layer 104 may be formed on semiconductor substrate 102 by depositing a metal material by using any of various methods, such as an ion beam method, an electron beam method, an RF sputtering method, or a physical vapor deposition (PVD) method. Then, photoresist pattern 106 defining a groove region can be formed on metal layer 104. Alternatively, photoresist pattern 106 may define an indentation, such as a spot, square or oval. For example, the spot may have substantially the same shape as a subsequently formed contact hole, which may maximize the increase in the contact surface (or interface) area when the indentation is fully exposed by the contact hole. Here, metal layer 104 may have a thickness of about 4,000 Å-6,000 Å, and photoresist pattern 106 may have a thickness of less than about 2,000 Å, but generally greater than a depth of the groove or indentation. Metal layer 104 may comprise a metal, such as aluminum (Al) or an aluminum-copper alloy, which may have an adhesive and/or barrier layer on either or both sides thereof, such as a titanium adhesive layer/titanium nitride (TiN) barrier layer/bulk aluminum layer/titanium adhesive layer/titanium nitride (TiN) barrier layer stack.

Figure 1B:
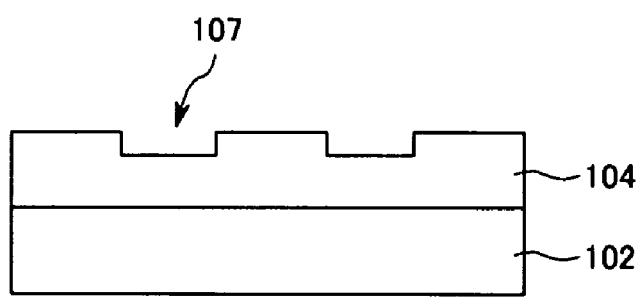

Subsequently, as shown in FIG. 1B, a groove 107 having a predetermined width may be formed by etching metal layer 104 to a predetermined depth. The groove (or other indentation) 107 is generally defined by photoresist pattern 106. Then, a cleaning process can be performed and photoresist pattern 106 may be removed (or vice versa). Here, groove 107 formed on the metal layer 104 may have a depth of about 500 Å-1,500 Å, for example.

Figure 1C:
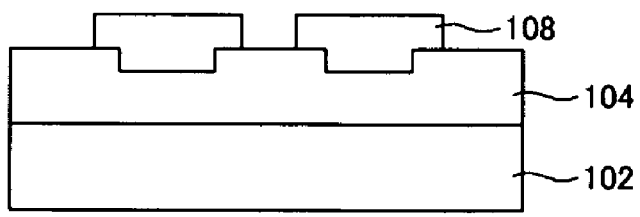

Subsequently, as shown in FIG. 1C, a photoresist pattern 108 defining a region wider than groove 107 can be formed on metal layer 104.

Figure 1D:
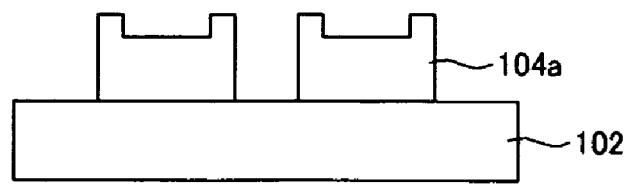

Then, as shown in FIG. 1D, a lower metal line 104a having groove 107 thereon can be formed by dry etching metal layer 104 according to photoresist pattern 108. Consequently, as is apparent from a comparison of FIGS. 1B and 1D, a plurality of grooves or indentations 107 may be formed by partially etching first locations in the upper surface of metal layer 104, and the metal layer 104 is fully etched in second locations that are not coincident with the first locations where the grooves or indentations 107 are formed.

Here, the etchant for etching metal layer 104 may comprise $BCl_3$ and/or $Cl_2$ gas (generally activated in a plasma), and an etch selectivity of the metal layer 104 is at least 1:1 with respect to the photoresist 108. Here, etch selectivity denotes of a ratio of etch rates of the two layers (usually of the metal layer 104 to the photoresist 108). For example, when the etch rate of metal layer 104 is 1,000 Å/min and the etch rate of photoresist pattern 108 is also 1,000 Å/min, the etch selectivity of the two layers becomes 1:1. However, conditions for plasma etching the metal layer 104 are generally sufficient to provide an etch selectivity of greater than 1:1 (e.g., $\geq 1.5:1$, $\geq 2:1$, $\geq 3:1$, etc.). Subsequently, a cleaning process can be performed and photoresist pattern 108 is removed (in either order).

Figure 1E:
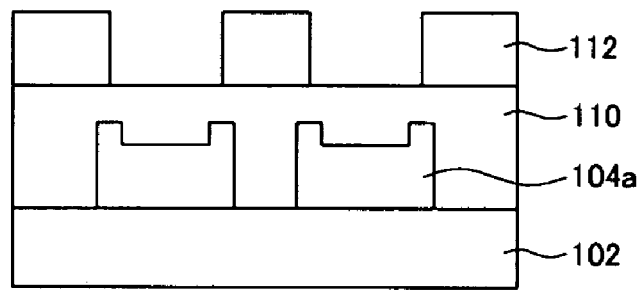

Then, as shown in FIG. 1E, insulator layer 110 may be formed over semiconductor substrate 102 and lower metal line 104a by depositing an insulating material, such as an HDP oxide layer, by a PVD method or a chemical vapor deposition (CVD) method, for example. Then, a top surface of insulator layer 110 may be planarized by a CMP process. Next, photoresist pattern 112 for forming contact hole 113 (see FIG. 1F) exposing groove 107 of lower metal line 104a can be formed on insulator layer 110.

Figure 1F:
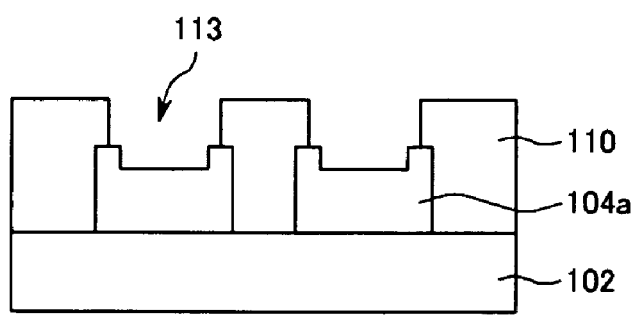

Subsequently, as shown in FIG. 1F, contact hole 113 may be formed by etching insulator layer 110 according to photoresist pattern 112 formed on insulator layer 110. Then, a cleaning process can be performed and photoresist pattern 112 removed (in either order).

Figure 1G:
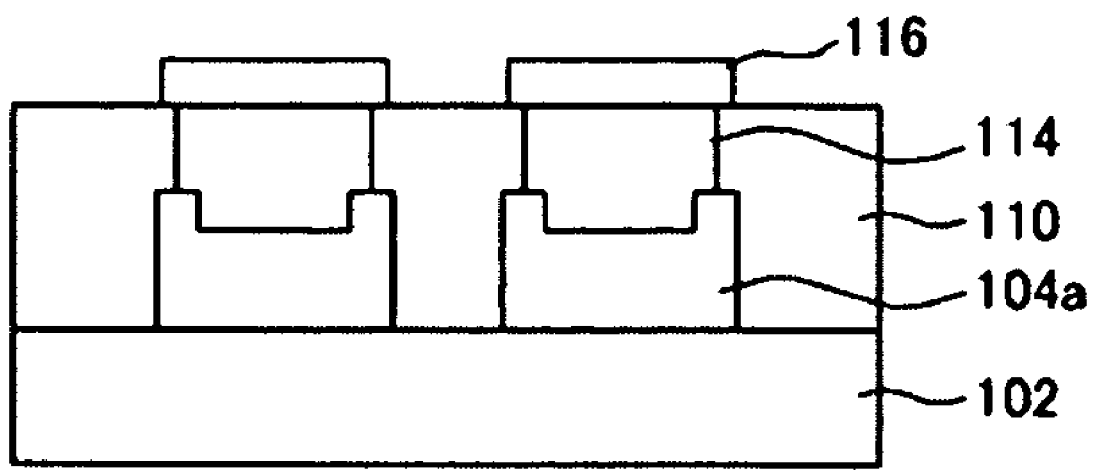
Figure 2A:
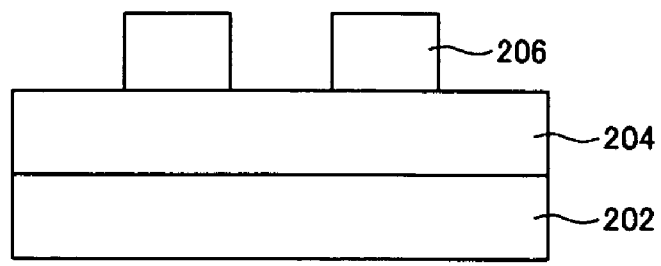
FIG. 2A to FIG. 2E are cross-sectional views showing sequential stages of a conventional method for forming a metal line in a semiconductor device.
Figure 2B:
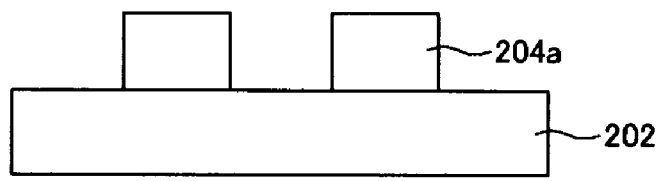
Figure 2C:
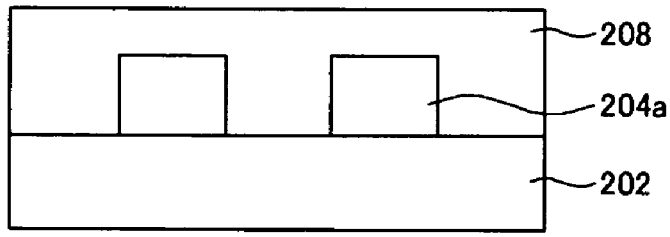
Figure 2D:
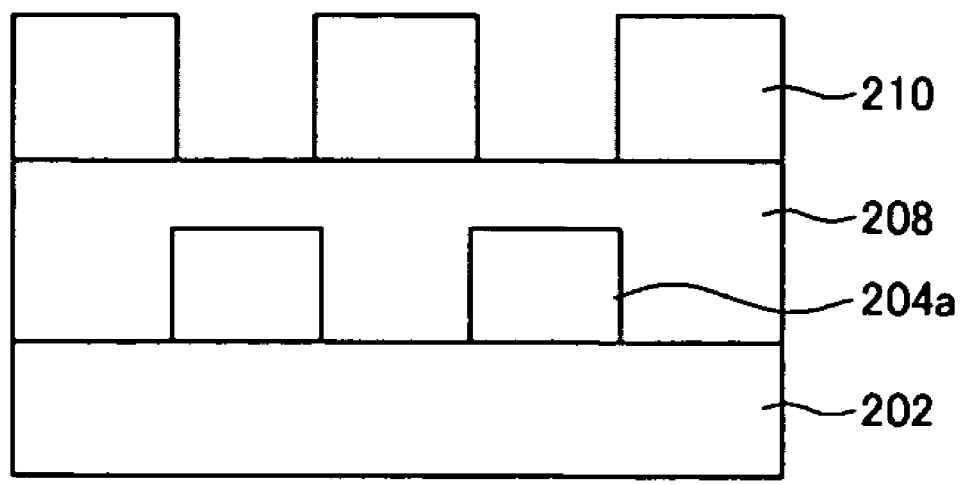
Figure 2E:
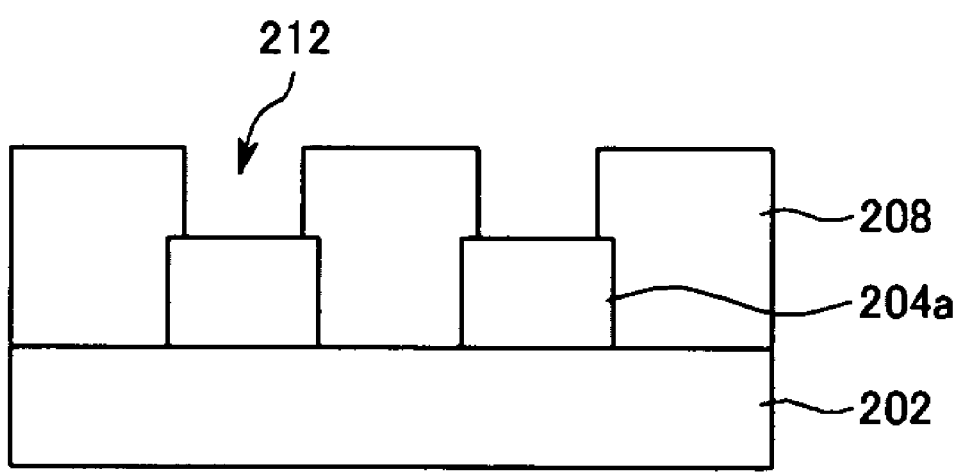

Subsequently, as shown in FIG. 1G, contact electrode 114 can be formed by filling a metal material in contact hole 113, generally by a chemical vapor deposition (CVD) method. The contact electrode may comprise, for example, tungsten (W), and before depositing the bulk contact electrode material, the contact hole may be first lined with an adhesive and/or barrier layer, such as a titanium adhesive layer and/or titanium nitride (TiN) barrier layer. A metal layer can be formed thereabove by depositing a metal material by any of various methods, such as an ion beam method, an electron beam method, or an RF sputtering method. Then, an upper metal line 116 may be formed by etching the metal layer according to a photoresist pattern (not shown). Then, the photoresist pattern (not shown) can be removed.

As described above, according to an exemplary embodiment of the present invention, a groove or other indentation may be formed on an upper surface of a lower metal line, thereby reducing contact resistance since an effective contact area of a contact electrode formed above the lower metal line is increased.

In addition, reliability of a semiconductor device made according to the present invention may be enhanced by the lowered contact resistance.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of forming a metal line in a semiconductor device, comprising:
    forming a metal layer on a semiconductor substrate;
    forming a groove in an upper surface of the metal layer by etching the metal layer;
    etching the metal layer so as to form a lower metal line having a width greater than a width of the groove;
    forming an insulator layer covering the semiconductor substrate and the lower metal line;
    etching the insulator layer to form a contact hole exposing at least part of the groove and a top surface of the lower metal line; and
    forming a contact electrode filling the contact hole and an upper metal line connected thereto above the insulator layer.

2. The method of claim 1, wherein the metal layer has a thickness of about 4,000 Å-6,000 Å.

3. The method of claim 1, wherein the groove of the metal layer has a depth of about 500 Å-1,500 Å.

4. The method of claim 1, wherein the metal layer comprises aluminum (Al) and/or titanium nitride (TiN).

5. The method of claim 1, wherein etching the metal layer comprises plasma etching the metal layer with a gas comprising $BCl_3$ and/or $Cl_2$ at an etch selectivity at least 1:1 with respect to an overlying photoresist.

6. The method of claim 5, wherein:
    the metal layer has a thickness of about 4,000 Å-6,000 Å; and
    the groove of the metal layer has a depth of about 500 Å-1,500 Å.

7. A semiconductor device, comprising:
a semiconductor substrate;
a lower metal line on the semiconductor substrate and having a groove at a top surface thereof;
an insulator layer above the lower metal line having a contact hole therein exposing at least a part of the groove and a top surface of the lower metal line;
a contact electrode in the contact hole; and
an upper metal line in contact with the contact electrode.

8. The semiconductor device of claim 7, wherein the lower metal line has a thickness of about 4,000 Å-6,000 Å.

9. The semiconductor device of claim 8, wherein the lower metal line comprises aluminum (Al) and/or titanium nitride (TiN).

10. The semiconductor device of claim 8, wherein the contact hole has a width of greater than a width of the groove.

11. The semiconductor device of claim 8, wherein the groove of the lower metal line has a depth of about 500 Å-1,500 Å.

12. The semiconductor device of claim 11, wherein:
the groove of the lower metal line has a depth of about 500 Å-1,500 Å.

13. A method, comprising:
partially etching a metal layer on a semiconductor substrate to form a plurality of grooves or indentations in an upper surface of the metal layer at a plurality of first locations, the grooves or indentations having a first width;
fully etching the metal layer at a plurality of second locations so as to form a plurality of lower metal lines having a second width, the second width being greater than the first width, and the second locations not coinciding with the first locations;
forming an insulator layer over the lower metal line; and
etching the insulator layer to form a plurality of contact holes exposing the indentation or at least part of the groove and a top surface of the metal line.

14. The method of claim 13, further comprising forming a contact electrode filling the contact hole.

15. The method of claim 14, further comprising forming an upper metal line electrically connected to the contact electrode contact electrode.

* * * * *